United States Patent [19]

Patterson

[11] Patent Number: 4,623,999
[45] Date of Patent: Nov. 18, 1986

[54] LOOK-UP TABLE ENCODER FOR LINEAR BLOCK CODES

[75] Inventor: Patricia L. Patterson, St. Petersburg, Fla.

[73] Assignee: E-Systems, Inc., Dallas, Tex.

[21] Appl. No.: 617,167

[22] Filed: Jun. 4, 1984

[51] Int. Cl.$^4$ ............................................. G06F 11/08
[52] U.S. Cl. ........................................ 371/37; 371/40; 371/43; 371/45
[58] Field of Search ................. 371/37, 38, 39, 40, 371/43, 45, 44; 364/200, 900

[56] References Cited

U.S. PATENT DOCUMENTS

| | | | |
|---|---|---|---|
| 4,020,461 | 4/1977 | Adams | 371/37 |
| 4,030,067 | 6/1977 | Howell | 371/37 |
| 4,099,160 | 7/1978 | Flagg | 371/37 |
| 4,291,406 | 9/1981 | Bahl | 371/44 |
| 4,312,069 | 1/1982 | Ahamed | 371/37 |
| 4,359,772 | 11/1982 | Patel | 371/38 |
| 4,414,667 | 11/1983 | Bennett | 371/39 |
| 4,466,099 | 8/1984 | Meltzer | 371/37 |
| 4,473,902 | 9/1984 | Chen | 371/37 |
| 4,509,172 | 4/1985 | Chen | 371/38 |

*Primary Examiner*—Michael R. Fleming
*Attorney, Agent, or Firm*—Albert M. Crowder, Jr.

[57] ABSTRACT

An efficient look-up table encoder for encoding k bit information words with linear error correcting block codes is provided comprising a plurality of read-only memories having $2^{x_1}$, $2^{x_2}$, ..., and $2^{x_i}$ address locations, respectively, where $x_1+x_2+ \ldots x_i=k$. Each of the read-only memories receives a portion of a k bit information word that serves to address a respective location therein, thereby mapping the portion of the k bit information word into an output word stored at the location. Corresponding bits of output words from the plurality of read-only memories are mod-2 summed by n−k exclusive-OR gates to generate a parity word associated with the information word. For systematic encoding, the parity word is then appended to the information word to form a codeword uniquely associated with the information word. This encoding scheme obviates look-up tables having $2^k \times (n-k)$ storage locations.

14 Claims, 3 Drawing Figures

LOOK-UP TABLE ENCODER FOR LINEAR BLOCK CODES

TECHNICAL FIELD

The present invention relates generally to encoding schemes and particularly to an efficient look-up table encoder for linear block codes.

BACKGROUND OF THE INVENTION

The use of linear block codes for error detection and correction in digital data transmission is well-known. Such codes act on information in blocks, each block forming an information word to be transmitted or stored. In the case of cyclic linear block codes, a codeword uniquely related to each information word is produced during the encoding scheme, this codeword being divisible by a fixed generator word. At the receiver, a received codeword is divided by the generator word. If a non-zero remainder results from this division, then errors have occurred during transmission. Moreover, this remainder, or syndrome, is uniquely related to an error pattern which is then corrected.

Suitable codewords for such schemes have been generated in a variety of ways. For systematic encoding of cyclic codes, one such method utilizes serial data input/output wherein each information word is applied to an $(n-k)$-stage shift register with feedback connections based on a generator polynomial. After the information bits are shifted into the register and simultaneously into the communication channel, the $n-k$ parity bits formed in the register are shifted into the channel, thus forming the complete codeword. This approach, however, is incompatible with parallel data input/output. To overcome this problem, suitable codewords have also been generated by table look-up encoding schemes which serve to map the k bits of each information work to $n-k$ parity bits. These $n-k$ parity bits are then appended to the k bits of each information word to define the codeword uniquely associated with each information word.

Standard look-up table encoding, however, requires memory devices with $2^k$ address locations. Such encoding schemes are thus impractical for medium length information words, and prohibitively complex and expensive when k is large. There is therefore a need for an efficient table look-up encoding scheme for linear block codes which obviates such large memory requirements.

SUMMARY OF THE INVENTION

The present invention describes an efficient look-up table encoder for encoding k bit information words with a linear error correcting block code which does not require storage devices having $2^k$ address locations. In the preferred embodiment, the encoder includes a plurality of storage devices having $2^{x_1}, 2^{x_2}, \ldots,$ and $2^{x_i}$ address locations, respectively, where $x_1 + x_2 + \ldots + x_i = k$. Each of the storage devices receives a portion of a k bit information word that serves to address a respective location therein, thereby mapping the portion of the k bit information word into an output word stored at the location. The output words from the plurality of storage devices are then summed to generate a parity word associated with the information word. For systematic encoding of a linear block code, the parity word is appended to the information word to form a codeword uniquely associated with the information word.

Preferably, each of the storage devices is a programmable read-only memory (PROM). For systematic encoding, corresponding bits of output words from the plurality of PROM's are mod-2 summed by $n-k$ exclusive-OR gates to generate the parity word, which is then appended to the information word to form the unique codeword.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
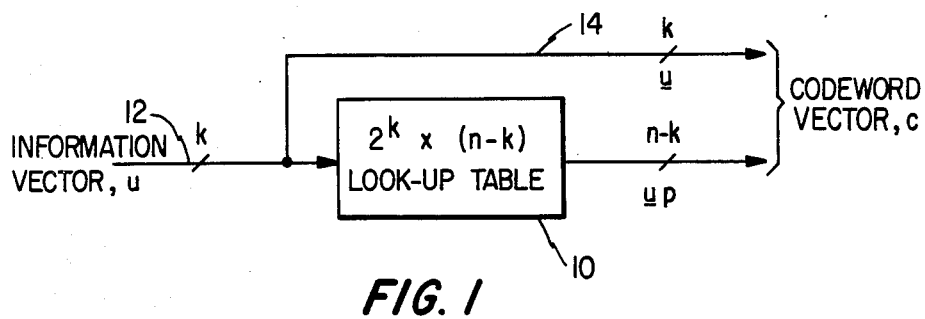
FIG. 1 is a block diagram of a standard look-up table encoder of the prior art for encoding systematic linear block codes.

Referring now to the drawings wherein like reference characters designate like or similar parts throughout the several views, FIG. 1 is a block diagram of a standard look-up table encoder of the prior art. This encoder is utilized to generate a lengthened codeword vector c uniquely related to each information word vector, u. Referring to FIG. 1, the information word vector u, which is a component vector of k information bits, is applied to the look-up table 10 via line 12. The look-up table 10 has $2^k$ address locations each of which stores an $n-k$ length digital word. In the case of systematic encoding of a linear block code, the information word vector u also forms part of the codeword vector c via line 14. In operation, the information word vector u serves as an address to the look-up table 10 to select a parity word of $n-k$ parity bits located at one of the $2^k$ address locations. The look-up table 10 thus maps the information word vector u to uP where P represents a parity check matrix unique to a given block code. As seen in FIG. 1, the first k bits of the codeword vector c are the same as the k information bits. The standard look-up table encoding scheme then maps the k information bits to the $n-k$ parity bits of the parity word given by uP. These parity bits are then appended to the information bits to define a codeword uniquely associated with the information word.

Standard implementation of the look-up table encoder 10 of FIG. 1 requires storage devices with $2^k$ address locations $n-k$ bits in length. Such prior art look-up table encoders are therefore impractical even for medium length information words. Moreover, when k is large, look-up table encoders such as shown in FIG. 1 are prohibitively expensive due to these large memory requirements.

To ameliorate this problem, according to the present invention, the $2^k \times (n-k)$ memory device 10 of FIG. 1 is replaced with $2 \leq i < k$ smaller memory devices of $2^{x_1}, 2^{x_2}, \ldots,$ and $2^{x_i}$ address locations, respectively, where $x_1 + x_2 + \ldots + x_i = k$. To appreciate the advantages of the present invention, it should first be noted that the $n-k$ parity bits given by uP may be written in the form:

$$\underline{u}P = [u_1 u_2 \ldots u_k] \begin{bmatrix} p_{11} p_{12} \cdots p_{1(n-k)} \\ \vdots \\ p_{k1} p_{k2} \cdots p_{k(n-k)} \end{bmatrix} \quad (1)$$

If each of the row vectors of the parity check matrix P in equation (1) is written as $p'_k$, then the $n-k$ parity check bits can be designated as:

$$\underline{u}P = [u_1 u_2 \ldots u_k] \begin{bmatrix} p'_1 \\ p'_2 \\ \vdots \\ p'_k \end{bmatrix} = u_1 p'_1 + u_2 p'_2 + \ldots + u_k p'_k \quad (2)$$

Now, if each of the elements of the information word vector u, which has $2^k$ possible values, is partitioned as follows:

$$[u_1 u_2 \ldots u_k] = [u_1 u_2 \ldots u_{x_1} : u_{x_1+1} u_{x_1+2} \ldots u_{x_1+x_2} : \ldots : u_{k-x_i+1} \ldots u_k], \quad (3)$$

then equation (2) can be written as:

$$\underline{u}P = (u_1 p'_1 + u_2 p'_2 + \ldots + u_{x_1} p'_{x_1}) + (u_{x_1+1} p'_{x_1+1} + \ldots + u_{x_1+x_2} p'_{x_1+x_2}) + \ldots + (u_{k-x_i+1} p'_{k-x_i+1} + \ldots + u_k p'_k). \quad (4)$$

As will be discussed in more detail below, the association of vectors as set forth in equation (4) allows replacement of the $2^k \times (n-k)$ look-up table 10 as shown in FIG. 1 with $2 \leq i < k$ memory devices of $2^{x_1}, 2^{x_2}, \ldots$ and $2^{x_i}$ address locations, respectively, where $x_1 + x_2 + \ldots + x_i = k$.

Figure 2:
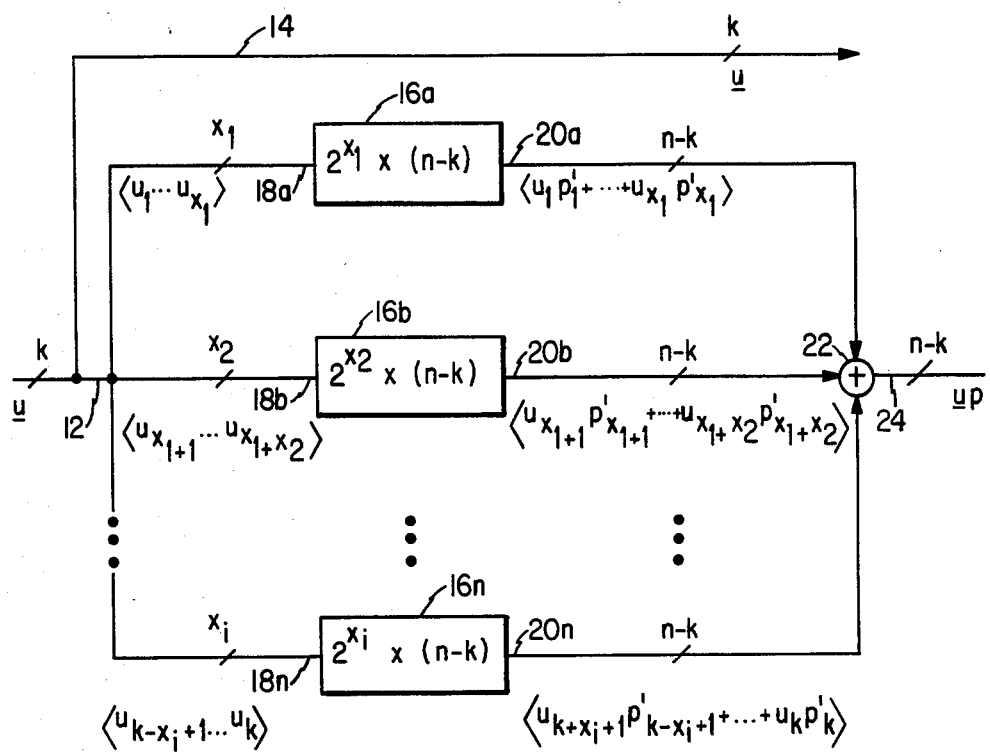
FIG. 2 is a block diagram of the look-up table encoder according to the present invention for encoding systematic linear block codes.

Referring now to FIG. 2, a block diagram of the look-up table encoder of the present invention is shown.

In particular, the look-up table 10 of FIG. 1 is replaced by a plurality of storage devices 16a, 16b, ... 16n. The k bit information word vector u is supplied to the look-up table encoder via line 12, and to the storage devices 16a, 16b, ... 16n via the lines 18a, 18b, ... 18$n_{x1}$, respectively. More specifically, storage device 16a has 2 address locations which are addressed by an $x_1$ bit-in-length portion of the information word vector u. In particular, the portion of the information word vector supplied via line 18a to the storage device 16a is represented by the vector:

$$[u_1 u_2 \ldots u_{x_1}] \quad (5)$$

This portion of the information word vector addresses the storage device 16a to select an output word of $n-k$ bits at one of the $2^{x_1}$ address locations. Similarly, the storage device 16b having $2^{x_2}$ address locations is addressed by a $x_2$ bit-in-length portion of the information word vector u. As seen in FIG. 2, this portion of the information word vector selects an output word of $n-k$ parity bits at one of the $2^{x_2}$ address locations and is represented by the vector:

$$[u_{x_1+1} u_{x_1+2} \ldots u_{x_1+x_2}] \quad (6)$$

Finally, the storage device 16n having $2^{x_i}$ address locations is addressed by an $x_i$ bit-in-length portion of the information word vector u. This portion of the information word vector selects an output word of $n-k$ parity bits at one of the $2^{x_i}$ address locations and is represented by the vector:

$$[u_{k-x_i+1} u_{k-x_i+2} \ldots u_k]. \quad (7)$$

The output of storage device 16a is provided on line 20a and as discussed above, is an $n-k$ bit output word. In particular, the $x_1$ bit vector applied to the storage device 16a serves to identify the output word:

$$[u_1 p'_1 + u_2 p'_2 + \ldots + u_{x_1} p'_{x_1}] \quad (8)$$

Similarly, the output of storage device 16b is provided on line 20b and has the following form:

$$[u_{x_1+1} p'_{x_1+1} + \ldots + u_{x_1+x_2} p'_{x_1+x_2}] \quad (9)$$

Likewise, the output of storage device 16n is provided on line 20n and is represented by::

$$[u_{k-x_i+1} p'_{k-x_i+1} + \ldots + u_k p'_k] \quad (10)$$

Therefore, it can be seen that when summed, the output words provided from the storage devices 16a, 16b, ... 16n represent the various association of vectors set forth in equation (4).

Referring back to FIG. 2, each of the output words or vectors on lines 20a, 20b, ... 20n, respectively, are then applied to $n-k$ mod-2 adders represented generally by the symbol 22. The $n-k$ adders 22 sum the output words applied thereto to form the $n-k$ parity bits uP which are then output from the look-up table encoder via line 24. As discussed above, the $n-k$ parity word bits uP are then appended to the k information word bits during systematic encoding of the linear block code.

Therefore, according to the present invention association of the vectors as set forth in equation (4) allows replacement of a $2^k \times (n-k)$ storage device with $2 \leq i < k$ smaller storage devices of $2^{x_1}, 2^{x_2}, \ldots$ and $2^{x_i}$ address locations, respectively, where $x_1 + x_2 + \ldots + x_i = k$. Each of these storage devices receives a portion of a k bit information word that serves to address a respective location therein, thereby mapping the portion into an output word associated with each storage device. The output words are then summed in $n-k$ mod-2 adders to generate a parity word associated with each information word.

In the preferred embodiment of the invention, the storage devices 16a, 16b, ... 16n of FIG. 2 are read-only memories (ROM's), or programmable read-only memories (PROM's) where appropriate, such devices being programmed with binary information defining the parity check matrix P unique to a given block code. It should also be appreciated that the amount of storage locations in the memory devices 16a, 16b, ... 16n may be equal or variable. More specifically, the values of $x_1$, $x_2$, ... $x_i$ may be identical or take on different values such that the number of address locations $2^{x_1}, 2^{x_2}, \ldots 2^{x_i}$, respectively, for each storage device may vary. The only constraint on the size of these storage devices is that $x_1 + x_2 + \ldots + x_i = k$. By way of example only, if $k = 10$, i.e., a 10 bit information word is desired to be transmitted, then the table look-up encoder of the present invention may utilize two ROM's having $2^8$ and $2^2$ address locations, respectively, or two ROM's each having $2^5$ address locations, or three PROM's having $2^3$, $2^3$ and $2^4$ address locations, respectively, and so forth. It can be seen therefore that the table look-up encoder of the present invention obviates the large memory devices normally associated with prior art look-up schemes. Moreover, except for the n−k mod-2 adders, which are relatively inexpensive as compared to the cost of memory, no additional hardware is required by the encoder.

Figure 3:
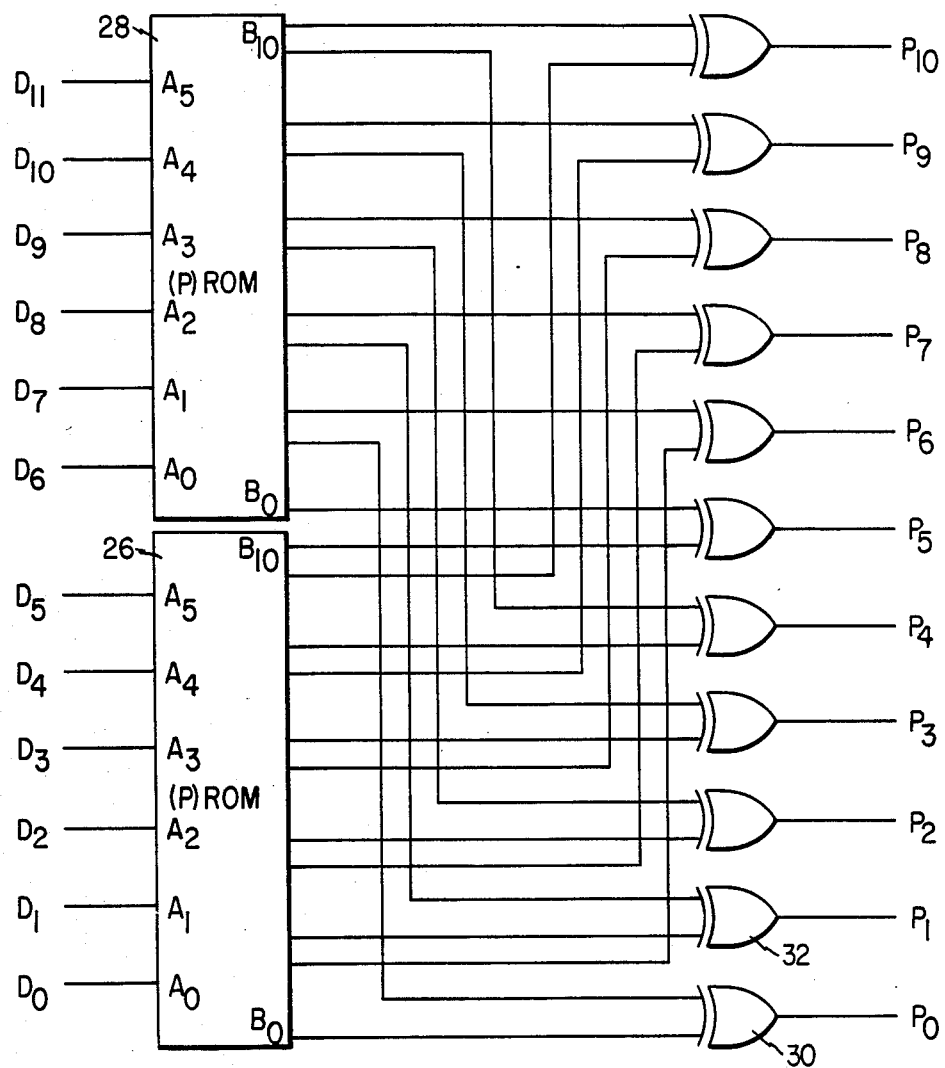
FIG. 3 is a schematic diagram of a look-up table encoder for a Golay linear block code.

Referring now to FIG. 3, a schematic diagram of a Golay linear block code encoder is shown which incorporates the table look-up scheme of the present invention. This encoder includes two storage devices, (P)ROM 26 and (P)ROM 28. As seen in FIG. 3, the 12 bit information word is separated into two portions having bits $D_0-D_5$, and $D_6-D_{11}$, respectively. The (P)ROM 26 has address inputs $A_0-A_5$ for receiving the first portion of the 12 bit information word comprising bits $D_0-D_5$. Similarly, (P)ROM 28 includes address inputs $A_0-A_5$ for receiving the second portion of the 12 bit information word comprising bits $D_6-D_{11}$. Therefore, in the Golay encoder of FIG. 3, two (P)ROM's are provided with $x_1=x_2=6$. Referring back to FIG. 3, each (P)ROM 26 and 28 has eleven outputs $B_0-B_{10}$ corresponding to n−k where n=23 and k=12. The bits $B_0-B_{10}$ of (P)ROM 26 form a first output word, while the bits $B_0-B_{10}$ of (P)ROM 28 form a second output word. Corresponding bits of the first and second output words are then mod-2 summed as discussed above with respect to FIG. 2 to form the respective parity bits $P_0-P_{10}$ of a parity word associated with the information word. In particular, bits $B_0$ from the (P)ROM's 26 and 28 are mod-2 summed in the exclusive-OR gate 30 to produce the parity bit $P_0$ of a parity word. Similarly, bits $B_1$ output from the (P)ROM's 26 and 28 are mod-2 summed in the exclusive-OR gate 32 to produce the parity bit $P_1$, and so forth. In systematic encoding of the Golay linear block code, the parity bits $P_0-P_{10}$ are then appended to the information word bits $D_0-D_{11}$ to form the codewords uniquely associated with the $2^{12}$ possible information words.

It should be recognized that the use of two (P)ROM's as set forth in FIG. 3 is simply a matter of choice. As discussed above, the Golay encoder could also have been formed utilizing three (P)ROM's and 22 exclusive-OR gates, or alternatively 12 (P)ROM's and 121 exclusive-OR gates, and so forth.

The present invention therefore provides an efficient look-up table encoder for linear block codes which is more practical and flexible than presently existing look-up table encoding schemes. This flexibility is provided by replacement of the standard $2^k \times$ (n−k)$_{x1}$ storage device with $2 \leq i < k$ smaller storage devices of $2^{x_1}, 2^{x_2}, \ldots$ and $2^{x_i}$ address locations, respectively, where $x_1+x_2+\ldots+x_i=k$, and with n−k exclusive-OR gates. By way of example only, while standard look-up table encoding of a (63,45,3) BCH linear block code requires a plurality of large storage devices for storing the $2^{45}=3.5\times 10^{13}$ entries, the present invention requires only 5 (P)ROM's each having $2^9$ address locations or a total of 512 entries per (P)ROM.

The present invention may also be used in non-systematic encoding of a linear block code whereby the first portion of the lengthened codeword does not correspond to the information word itself. In this case, the entire generator matrix is utilized instead of just the parity check matrix P. Accordingly, in operation a portion of the k bit information word is mapped into an n bit output word by each $2^k \times$ n storage device, and the n bit output words are mod-2 summed to generate an n bit codeword.

Moreover, the present invention is also applicable to the encoding of M-ary non-binary (M>2) linear block codes in which case each vector component represents a symbol comprised of $\log_2$ M bits. In a non-binary block code, such as a Reed-Solomon code, a plurality ($\log_2$ M) of bits are utilized to define galois field symbols in the information words. Accordingly, when the look-up table encoder of the present invention is utilized to encode k symbol information words (each having k $\log_2$ M bits) with a linear error correcting non-binary block code, portions $x_1 \log_2 M$, $x_2 \log_2 M, \ldots,$ and $x_i \log_2 M$ of the information word vector are supplied to the various storage devices 16a, 16b, . . . , and 16n, respectively, and each such portion must include an integral number of symbols. Specifically, all the bits which comprise a symbol must be applied to a respective storage device, and the generated output words also include an integral number of symbols. The structure of the look-up table encoder of the present invention is the same as shown in FIG. 2 except that the storage devices 16a 16b . . . 16n have: $2^{x_1 \log_2 M}$, $2^{x_2 \log_2 M}, \ldots,$ and $2^{x_i \log_2 M}$ address locations, respectively.

Finally, it should also be appreciated that the look-up table encoder of FIG. 2 may be utilized to effect syndrome calculation in a receiver. Specifically, as noted above, a decoding algorithm in the receiver calculates a syndrome uniquely related to an error pattern. The look-up table encoder of the present invention can be utilized at the receiver to encode corrupted received information bits with the linear block code, with the output thereof being mod-2 summed with the received corrupted parity word to calculate the syndrome.

Although the invention has been described and illustrated in detail, it is to be clearly understood that the same is by way of illustration and example only and is not to be taken by way of limitation. The spirit and scope of this invention are to be limited only by the terms of the appended claims.

I claim:

1. A look-up table encoder for encoding a k bit information word with a linear error correcting block code to generate an n−k bit parity word, where n and k are positive integers, comprising:

a plurality of storage means respectively having $2^{x_1}$, $2^{x_2}, \ldots,$ and $2^{x_i}$ address locations, where i=1,2,3 . . . and $x_1+x_2+\ldots+x_i=k$, each of said address locations storing an output word having n−k bits;

means for applying a portion of the k bit information word to each of said storage means, said portion serving to address a respective location therein to map the portion into an output word stored at the respective location; and means for summing the output words from said plurality of storage means on a bit position-by-bit position basis to generate the parity word associated with said information word.

2. The look-up table encoder as described in claim 1 wherein each of said storage means is a read-only memory.

3. The look-up table encoder as described in claim 1 wherein $x_1=x_2=\ldots=x_i$.

4. The look-up table encoder as described in claim 1 wherein $x_1 \neq x_2 \neq \ldots \neq x_i$.

5. The look-up table encoder as described in claim 1 wherein $x_1=x_2=\ldots \neq x_i$.

6. The look-up table encoder as described in claim 1 wherein said means for summing includes $n-k$ exclusive-OR gates for receiving corresponding bits of said output words from said plurality of storage means.

7. The look-up table encoder as described in claim 6 wherein each of said $n-k$ exclusive-OR gate generates a bit of said parity word.

8. A look-up table encoder for encoding a k bit information word with a linear error correcting block code to generate an $n-k$ bit parity word, where n and k are positive integers, comprising:
- a plurality of programmable read-only memories respectively having $2^{x_1}$, $2^{x_2}$, ..., and $2^{x_i}$ address locations, where $i=1,2,3$ ... and $x_1+x_2+ \ldots +x_1=k$, each of said address locations storing an output word having $n-k$ bits;
- means for applying a portion of the k bit information word to each of said programmable read-only memories, said portion serving to address a respective location therein, to map the portion into an output word having $n-k$ output bits; and $n-k$ exclusive-OR gates for summing the output words from said programmable read-only memories on a bit position-by-bit position basis to generate the parity word associated with said information word.

9. The look-up table encoder as described in claim 8 wherein $x_1=x_2= \ldots =x_i$.

10. The look-up table encoder as described in claim 8 wherein $x_1 \neq x_2 \neq \ldots \neq x_i$.

11. The look-up table encoder as described in claim 8 wherein $x_1=x_2= \ldots \neq x_i$.

12. The look-up table encoder as described in claim 8 wherein each of said $n-k$ exclusive OR gates generates a bit of said parity word.

13. A look-up table encoder for encoding a k bit information word with a linear error correcting block code in non-systematic form to generate an $n-k$ bit parity word, where n and k are positive integers, comprising:
- a plurality of storage means respectively having $2^{x_1}$, $2^{x_2}$, ..., and $2^{x_i}$ address locations, where $i=1,2,3$ ... and where $x_1+x_2+ \ldots +x_i=k$, each of said address locations storing an n bit output word;
- means for applying a portion of the k bit information word to each of said storage means, said portion serving to address a respective location therein to map the portion into an output word stored at the respective location; and
- means for summing the n bit output words from said plurality of storage means on a bit position-by-bit position basis to generate the n bit codeword associated with said information word.

14. A look-up table encoder for encoding a k symbol information word with a linear error correcting M-ary ($M>2$) non-binary block code to generate a parity word, wherein groups of $\log_2 M$ bits are used to define symbols in said information word, comprising:
- a plurality of storage means respectively having $2^{x_1 \log_2 M}$, $2^{x_2 \log_2 M}$, ..., and $2^{x_i \log_2 M}$ address locations, where $i=1,2,3$ ... and $x_1+x_2+ \ldots +x_i=k$, each of said address locations storing an output word;
- means for applying a portion of the k symbol information word to each of said storage means, the portion including an integral number of said symbols and serving to address a respective location therein to map the portion into an output word stored at the respective location, the output word having an intergral number of said symbols; and
- means for summing said output words for said plurality of storage means on a symbol position-by-symbol position basis to generate the parity word associated with said information word.

* * * * *